United States Patent [19]
Eichelberger

[11] Patent Number: 5,091,769
[45] Date of Patent: Feb. 25, 1992

[54] CONFIGURATION FOR TESTING AND BURN-IN OF INTEGRATED CIRCUIT CHIPS

[76] Inventor: Charles W. Eichelberger, 1256 Waverly Pl., Schenectady, N.Y. 12308

[21] Appl. No.: 676,206

[22] Filed: Mar. 27, 1991

[51] Int. Cl.$^5$ .................................. H01L 23/28
[52] U.S. Cl. ...................... 357/72; 357/74; 357/75
[58] Field of Search ................. 357/72, 74, 75, 80

[56] References Cited

U.S. PATENT DOCUMENTS

| | | | |
|---|---|---|---|
| 4,709,254 | 11/1987 | Haghiri-Tehrani et al. | 357/72 |
| 4,714,516 | 12/1987 | Eichelberger et al. | 156/628 |
| 4,783,695 | 11/1988 | Eichelberger et al. | 357/65 |
| 4,835,704 | 5/1989 | Eichelberger et al. | 364/490 |
| 4,866,508 | 9/1989 | Eichelberger et al. | 357/74 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 4,901,136 | 2/1990 | Neugebauer et al. | 357/75 |
| 4,907,062 | 3/1990 | Fukushima | 357/75 |
| 4,918,811 | 4/1990 | Eichelberger et al. | 29/840 |
| 4,933,042 | 6/1990 | Eichelberger et al. | 156/239 |
| 4,953,001 | 8/1990 | Kaiser, Jr. et al. | 357/74 |
| 4,962,415 | 10/1990 | Yamamoto et al. | 357/74 |
| 4,985,753 | 1/1991 | Fujioka et al. | 357/80 |

FOREIGN PATENT DOCUMENTS

| | | | |
|---|---|---|---|
| 0141257 | 8/1984 | Japan | 357/75 |
| 0191460 | 8/1989 | Japan | 357/75 |

OTHER PUBLICATIONS

The STD-Process-New Developments and Applications, Clark et al., pp. 131-144, 1974, International Microwave Symposium.

Levinson et al., High Density Interconnects Using Laser Lithography, Proceed. of ISHM, Seattle, pp. 1-4, Oct. 1988.

*Primary Examiner*—Georgia Epps
*Attorney, Agent, or Firm*—Heslin & Rothenberg

[57] ABSTRACT

Packaging methods and configurations are disclosed for placing electronic integrated circuit chips into operable chip systems in a manner to facilitate burn-in and testability thereof. The invention addresses the problem of testing bare integrated circuit chips before they are committed to a multichip module. Further, it addresses the problem of burning-in bare chips under biased conditions so that chips with defects therein can be accelerated to failure, thereby avoiding their incorporation into a multichip integrated circuit module. Pursuant to the invention, special connection arrays are disposed in spacer blocks in a predetermined configuration on a substrate. The blocks define areas of the substrate which preferably accommodate a plurality of integrated circuit chips such that each chip is surrounded on each side by a spacer block. One or more connection arrays may be provided in each spacer block. The connection arrays have interconnection pads which in the final structure are accessible to an external probing device. Specific methods of fabrication are also disclosed.

33 Claims, 3 Drawing Sheets

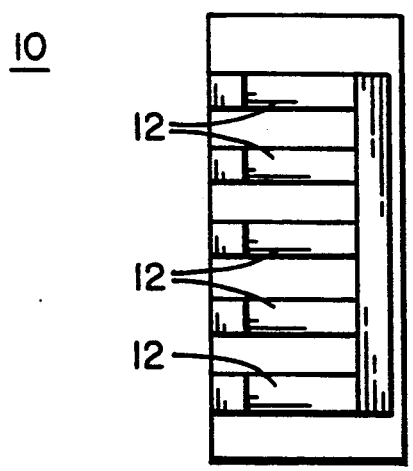
FIG. 1
FIG. 2
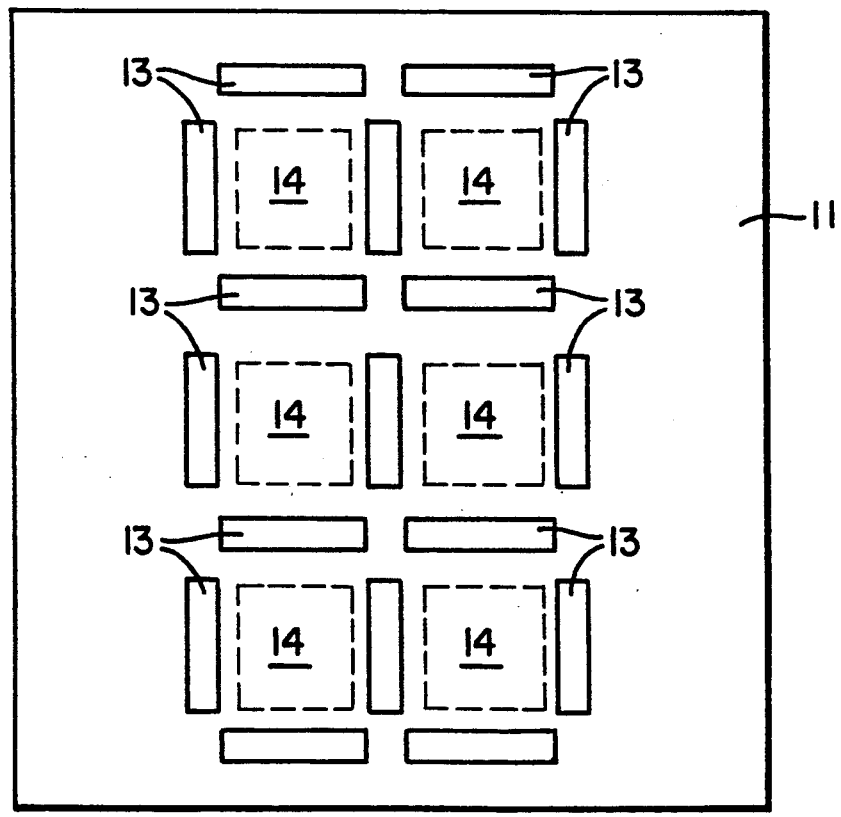

CONFIGURATION FOR TESTING AND BURN-IN OF INTEGRATED CIRCUIT CHIPS

BACKGROUND OF THE INVENTION

1. Technical Field

The present invention relates to packaging electronic integrated circuit chips into operable chip systems in a manner to facilitate burn-in and testability thereof. In particular, this invention addresses the problem of testing bare integrated circuit chips before they are committed to a multichip module. Further, it addresses the problem of burning in bare chips under bias conditions so that chips with defects which could cause premature failure can be accelerated to failure, thereby avoiding incorporation of bad chips into a module.

2. Description of the Prior Art

One basic problem with existing technology is that chips which are available are not fully tested. This is due to a number of factors. First, the present manufacturing approach is to test chips at the wafer level just to the point that insures that the chip will probably work in the final package. At this point, chips are packaged and then fully tested. This manufacturing approach is economical for two reasons. First, it is necessary to test the packaged circuit in all cases because of the possibility of failure during the packaging operation. Packaging failures can occur as a failed package, a failure in the die to package wire bonding process or damage to the die during operations subsequent to wafer probing including sawing and placement of die into a package. Second, the number of bad die which pass wafer probe but which subsequently do not pass full testing is relatively small. As a result, the cost of packaging die before full test is not significant. Another reason chips are not fully tested at the wafer level is due to limited speed capability in wafer probing systems. Typically, probes are relatively long and are not impedance stabilized. As a result, as frequencies increase, crosstalk and ringing on digital lines exceeds the noise margin of the system and makes testing impossible. Special test fixtures have been built which allow testing of packaged parts at high speed.

A new problem which limits full testing at the wafer level is due to the number of I/O pads on a given chip. As chip complexity increases, the number of pads on the chip increases to a point where probing all the pads on the chip at one time becomes difficult or impossible. A further complicating factor is the trend toward decreasing the size of chip pads. As the pad size decreases, the ability of conventional probes to make contact to the pads is decreased. These two problems again require that some method other than wafer probing be used to completely test the chips.

High performance testing probes are becoming available based on thin film technology. A major problem with the high performance thin film probe, however, is that it is very expensive and requires a custom system for optimum utilization. Finally, thin film bump probes do not make good electrical connection through the oxide on conventional aluminum pads. The problem here then is to provide a method which allows so called bump probes to make good electrical connection in the face of conventional aluminum chip pads and to utilize a single optimized bump probe configuration for probing a variety of integrated circuit chips.

Techniques are available for making temporary interconnection to area arrays of pads which give a high density of interconnect and good electrical performance. These techniques, however, are amenable to probing of printed circuit boards and not to probing of IC chips. This is due primarily to the fact that IC chips are available with pads on their periphery and not with area arrays of pads. In addition, the aluminum pad material on the chip is subject to damage by this probing approach. The problem then is that area array contact means such as pogo sticks and button contacts cannot be used for high performance, high interconnect density probing of IC chips.

Another problem relates to the burn-in of bare chips. Burn-in is required to eliminate the early failure of IC chips in a module such that chips which are prone to fail early in their life cycle are not incorporated into a module. In order to accelerate failures of this variety, it is generally required that the chips be operated at a high temperature and under bias conditions with power applied to the chips. In many situations, it is also desirable to apply a rudimentary level of clocking signal to exercise the chip in some way while the burn-in is occurring. This has been done in conventional systems by first packaging the chip and then placing the package in a socket which is mounted on a printed circuit board. Pins of the socket are connected through resistors to power. Clock points on the chips are connected to a clock and power is applied to the chip. Typically, packaged parts are burned-in for as long as 300 hours where very high reliability levels are required, such as spacecraft applications. Burning-in chips at the wafer level is not feasible because there is no provision for bias connection or connection of power, ground and clock signals to all chips on the wafer. The problem then is to find a method wherein a plurality of bare chips can be burned-in under bias.

Several patents have recently issued relating to strategies for bare chip testing, see, for example, U.S. Pat. Nos. 4,884,122 and 4,866,508. These patents relate to methods and structure for bare chip tests and burn-in and, in particular, to specific structures for obtaining temporary interconnect to chips for the purpose of test and burn-in. The disclosed invention also relates to methods and structure for bare chip test and burn-in. It should be noted that the basic concept of making temporary interconnect to a device for the purpose of testing that device is not new. The methods and structure which are disclosed in this invention distinguish over the methods disclosed in the prior art in an important aspect in that there is no requirement for application and subsequent peeling of any overlay layer. Instead, the disclosed structure of the present invention employs a solvent sensitive encapsulant, which (as described herein) has several practical advantages over the overlay approach.

SUMMARY OF THE INVENTION

In a preferred embodiment the present invention, an integrated circuit chip package comprises a substrate together with a plurality of integrated circuit chips affixed to the substrate. The integrated circuit chips have interconnection pads thereon for connection to other chips or to different parts of the same chip. A plurality of spacer blocks are disposed on the substrate such that each block is located at a side of a chip of the plurality of integrated circuit chips, with at least some of the spacer blocks being disposed between the chips. At least one of the plurality of blocks includes a connection array for applying one of a biasing signal, power signal, ground signal and clock signal to selected chip interconnection pads. Each connection array has a plurality of interconnection pads thereon. An encapsulant surrounds the integrated circuit chips and the spacer blocks such that the encapsulant has an upper surface above the tops of the circuit chips and the tops of the spacer blocks. The encapsulant is provided with via openings therein which are aligned with at least some of the chip interconnection pads and the connection array interconnection pads. Finally, a pattern of interconnection conductors is disposed on the upper surface of the encapsulant so as to extend between at least some of the openings and so as to provide electrical connection between some of the chip interconnection pads and the connection array interconnection pads through the openings.

In an enhanced embodiment, a plurality of the spacer blocks disposed about the chips include a connection array and at least one of the connection arrays comprises a resistive array for applying a biasing signal to selected chip interconnection pads. Further, the encapsulant, together with the pattern of interconnection conductors disposed thereon, is preferably removable. Also, each of the plurality of spacer blocks may include a connection array, with the connection arrays being positioned relative to the substrate in a predetermined footprint pattern.

In accordance with another embodiment of the present invention, a method for producing integrated circuit chip packages for testing begins by disposing in a predetermined pattern a plurality of spacer blocks on a substrate having a substantially flat upper surface. The spacer blocks are patterned to frame a multiplicity of areas on the substrate's upper surface. At least one of the plurality of blocks includes a connection array for applying one of a biasing signal, power signal, ground signal and clock signal to selected chip interconnection pads. The connection array has a plurality of interconnection pads thereon. A plurality of integrated circuit chips are also disposed on the substrate such that each chip resides in one of the areas framed by the spacer blocks. An encapsulant is then employed to surround the chips and the spacer blocks. The encapsulant has an upper surface above the tops of the chips and the spacer blocks. A plurality of via openings are provided in the encapsulant, with the openings being disposed over at least some of the chip interconnection pads and the connection array interconnection pads. As described above, a layer of metallization is provided on the encapsulant extending between the via openings so as to electrically connect selected chip interconnection pads and connection array interconnection pads through the openings. As above, a plurality of connection arrays may be disposed on the spacer blocks and a particular spacer block may have more than one connection array thereon.

In addition to applying burn-in conditions, in certain enhanced embodiments, the method of the present invention includes testing the integrated circuit chips disposed in the package by applying one of a biasing signal, power signal, ground signal and clock signal to selected chip interconnection pads using the at least one connection array disposed in the package. Subsequent testing, the method also includes recovering the integrated circuit chips from the package. In one specific recovery embodiment, the pattern of electrical conductors is first etched from the encapsulant, which preferably comprises a solvent sensitive material, and the encapsulant is then dissolved in a solvent. If desired, the adhesive holding the integrated circuit chips to the substrate may also comprise a solvent sensitive material, which is either sensitive to the same solvent as the encapsulant or a different solvent. Further features of the present invention are also described and claimed herein.

Accordingly, it is an object of the present invention to provide a method for pretesting and burn-in of unpackaged integrated circuit chips before the chips are committed to a multichip module.

Another object of the present invention is to provide a carrier which can handle a multiplicity of integrated circuit chips and which supplies at least one of power signals, ground signals, clock signals and bias signals to selected chip interconnection pads with a minimum number of external connections to the carrier.

Still another object of the present invention is to provide a method for fully testing bare integrated circuit chips at normal operating speed notwithstanding large numbers of chip input output pads.

A further object of the present invention is to provide a method and package for making contact to pads of an integrated circuit which are too small to be probed using conventional chip test apparatus.

A still further object of the present invention is to provide a method for temporary interconnect to a multiplicity of integrated circuits under test which provides little stress on the chips and protects the chips during the test and burn-in handling and which provides an easy and stress free high yield method of chip recovery.

A yet further object of the present invention is to provide a method and structure wherein pads of chips are brought to a common footprint for subsequent probing by a custom probe either of an area array configuration or of a thin film bump configuration.

Yet another object of the present invention is to provide good electrical contact to special purpose probes such as thin film bump probes, notwithstanding the existence of commercial aluminum pads.

Lastly, but not limited hereto, it is an object of the present invention to provide a carrier such that tested die can be recovered in situ and carried to the next processing operation while still being separately maintained from one another.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, can best be understood by reference of the following detailed description taken in conjunction with the accompanying drawings in which:

FIG. 1 is a plan view of one embodiment of a connection array pursuant to the present invention;

FIG. 2 is a plan view of one embodiment of a pattern of spacer blocks disposed on a substrate pursuant to the present invention;

DETAILED DESCRIPTION OF THE INVENTION

Figure 3A:
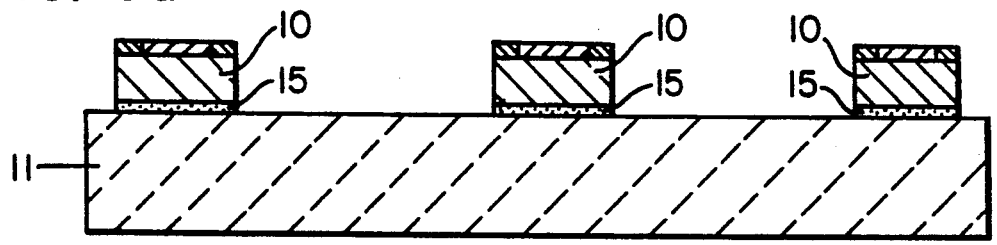
FIGS. 3a–3e are cross-sectional elevational views of an integrated circuit chip package at different stages during the fabrication, testing and recovery processes pursuant to the present invention.

In accordance with the present invention, a barechip carrier structure and method of fabrication are disclosed which provide the following attributes: (1) a means to separate the integrated circuit chips from one another; (2) a means to distribute power, ground and clock signals; (3) a means to bias inputs and appropriately load outputs for burn-in under bias conditions; (4) a means of interconnection from the chip to power, ground and clock signals and biasing resistors; and (5) a means of temporary interconnect which connects from pads on the chip to a predetermined common footprint pattern which can be probed by an appropriate probing method.

According to a presently preferred embodiment of the present invention, the attributes of separating chips and of providing bias resistors are combined in a single structure. This is done by fabricating a long, thin chip-like insert, generally denoted 10 in FIG. 1, which contains an array of bias resistors 12. Resistor array 12 is described in greater detail in a co-filed patent application Ser. No. 676,937, entitled "Multichip Integrated Circuit Module and Method of Fabrication," which is assigned to the same assignee as the present invention and which is fully incorporated herein by reference. In addition, insert 10 could be configured as a power or ground distribution chip, in which case a conductive material would be substituted for resistors 12.

FIG. 2 depicts the placement of inserts 10 on a carrier 11, i.e., in blocks 13, such that they provide the function of separating individual chips 14 from one another and also of providing bias resistors for input and output devices (not shown) on the chips 14. Each block 13 in FIG. 2 may comprise one or more than one chip-like insert 10. In addition, one or more (but preferably not all) of the blocks 13 about each IC chip 14 may simply comprise a spacer chip, i.e., a chip lacking a resistive array or other distributive array which would facilitate connection to multiple pads on the chip. Such a configuration would be acceptable, for example, if a minimum number of devices on the chip are to be biased during the burn-in process.

According to the resistor array fabrication method of the cross-referenced application, resistor material is deposited and patterned on a large substrate. Subsequently, end terminations are deposited and patterned and the large substrate is then sawed into the individual arrays of resistors. A die attach material 15 (FIG. 3a) such as DIEL3B available from Zeon Technology of Nashua, N.H. can be used to attach the resistor arrays. When this material is cured by baking at a temperature of 220° C. for twenty minutes it is insoluble in normal solvents. This creates an essentially permanent structure consisting of a flat substrate (i.e., carrier 11) with resistor array spacers 10 in blocks 13 permanently bonded to the substrate.

At this point, a solvent-sensitive die attach material 17 consisting of 50% cellosolveacetate and 50% high molecular weight epoxy can be used. This material is spin coated, and dried five minutes at 100° C. and five minutes at 150° C. Die attach proceeds by heating the substrate to a temperature of 100° C. and appropriately positioning the chips 14 on the substrate 11 within the spaces defined by blocks 13. At this point, the die attach material is soft and sticky. The die readily hold their position so that accurate placement can be achieved.

Figure 3B:
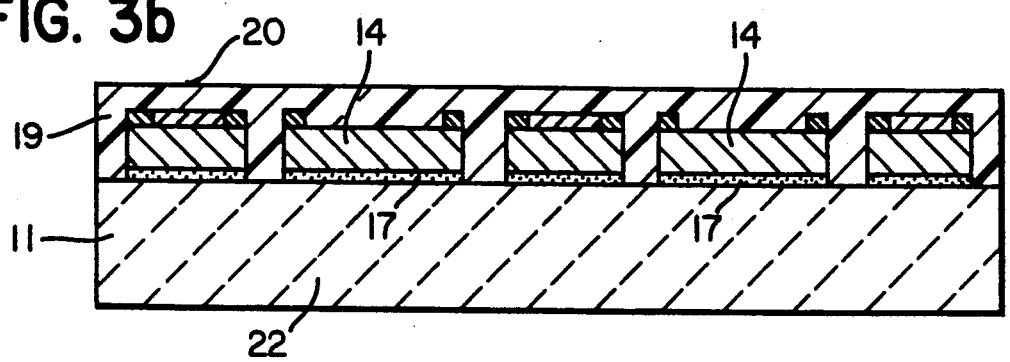

Encapsulation of the structure (FIG. 3b) is achieved by encapsulating the chips using the apply, cure and lap method disclosed in the cross-referenced application.

According to this method, an encapsulant material 19 is poured on the substrate and spun for a short period of time at a low spin speed. This results in a very thick coating of encapsulant material on top of and between the chips. After proper drying of the encapsulant, a lapping process is used to lap the encapsulant material 19 to within 1 or 2 mils of the top of the chips and to create a flat encapsulant surface 20 which is parallel with the lower surface 22 of the substrate 11. The particular encapsulant material used is preferably a material which is specifically designed to be solvent sensitive. As an example, a high molecular weight epoxy 75% by weight and 25% cellosolveacetate can be used. Drying proceeds for fifteen minutes at 100° C. and twenty minutes at 150° C. Spin conditions of ten seconds at a spin of 400 rpm are sufficient to spread the material relatively evenly over the substrate.

Figure 3C:
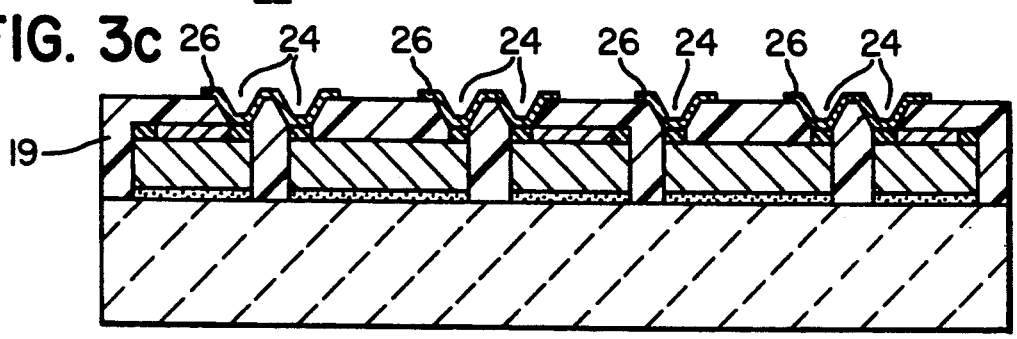

The next step in the process involves using an Excimer laser to form via holes 24 in the polymer material 19. One hundred pulses at a wave length of 248 nanometers is sufficient with an energy at the surface of 1 to 2 joules per centimeter square. After drilling the via holes, the substrate is placed in a sputtering chamber and titanium followed by copper is sputtered on the surface of the substrate and in the via holes. The actual sputtering operation for a Balzer 450 consists of two minute back sputtering at 1,000 watts using a pressure of 1 micron of argon followed by eight minutes of titanium with a magnitron sputtering unit at 2,200 watts followed by twenty minutes of copper at 2,200 watts. The metallization 26 is then patterned to create the desired footprint pattern and to make connection to the bias resistors and to make connection to bus circuitry which distributes power (FIG. 3c).

Figure 4:
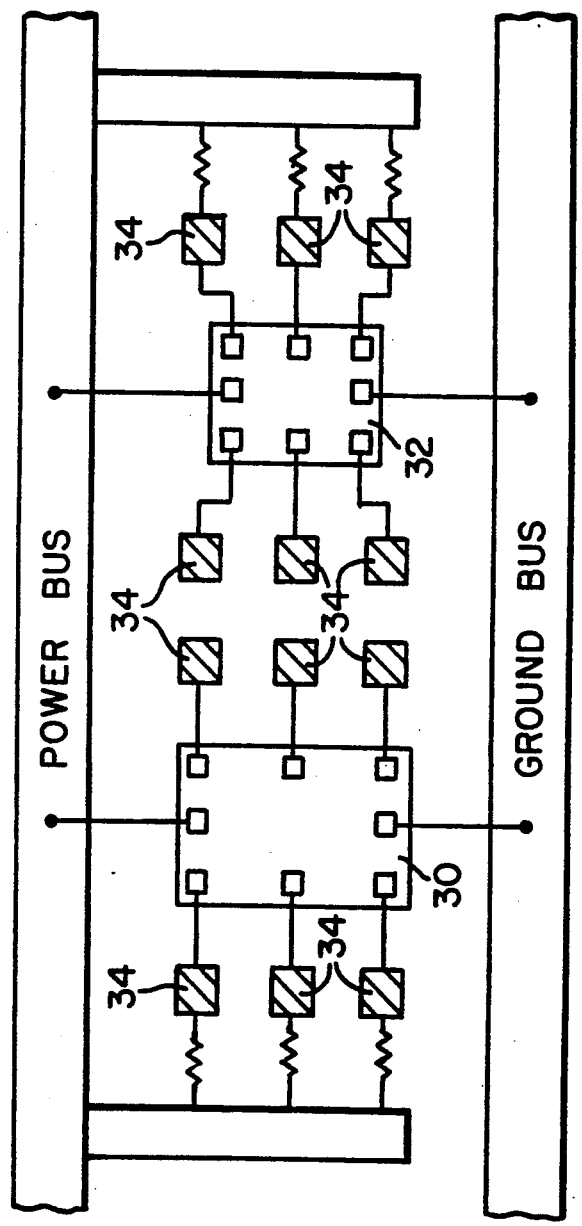
FIG. 4 is a schematic view of one circuit embodiment of an external connect pattern of conductors for testing of two integrated circuit chips pursuant to the present invention.

FIG. 4 shows a schematic representation of a typical footprint concept. It can be seen that although chips 30 and 32 of different sizes are connected, the external connect pattern of conductors 34 can be contacted by the same probing device. This basic concept can be extended to include pad array configurations which would match to a pogo probe or button contacts or alternatively the configuration can be matched to a thin film bump probe such as available from TekTronics of Beaverton, Oreg.

At the point where copper is patterned, it may be desirable to protect the copper from oxidation by a flash of electroless gold. The gold plating improves the contact by eliminating oxide on the metallization. An electroless gold plating system which will work is EL221 from Shippley Co., Newton, Mass. First, parts are dipped in a solution of 10% citric acid for three minutes followed by rinsing and dipping directly in the electroless gold bath operated at 50° C. for a period of fifteen minutes. This puts down a coating of approximately eight micro inches of gold.

Figure 3D:
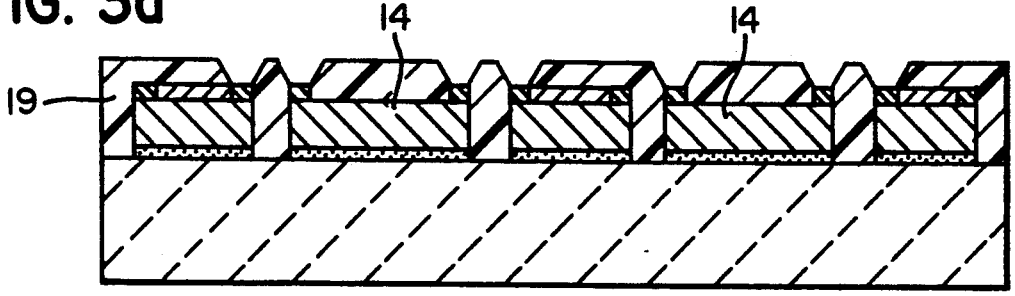
Figure 3E:
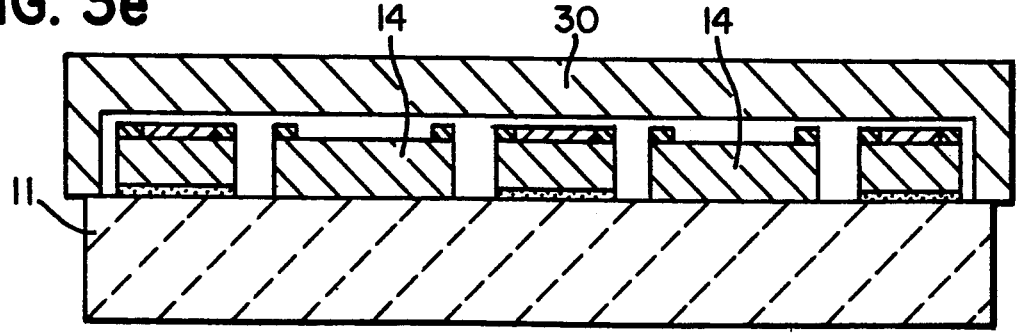

Chips can be recovered by the following procedure. The copper is etched in concentrated nitric acid for a period of one minute. The titanium is then etched using PAD etch available from Transene Corporation. This etches the titanium but does not attack the aluminum or gold pads of the chip and the resistor arrays. At this point, no metallization remains on the surface of the encapsulant 19 for making connection to the chips 14 (FIG. 3d). After the metallization has been removed the substrate is placed in a solvent which dissolves the encapsulant material 19 and which also dissolves the die attach material 17. This process of dissolving can be assisted by ultrasonic agitation. In the preferred embodiment, for the encapsulant and die attach material disclosed, acetone can be used as the solvent. Once the die attach material is dissolved the chips are free to be removed from the substrate. However, it is desirable to keep the chips on the substrate until they are ready to be placed in the final module. This can be done conveniently by placing a top 30 over the substrate 11 which is fitted to be a few mils above the height of the combination resistor—spacer elements. In this way, the chips can be conveniently held in place and carried on the substrate without danger of losing chips.

Two variations in the process can be used to enhance its value. First, a die attach material may be used which is not solventable in the same solvent that dissolves the encapsulant. Such a die attach material for example is RELY IMIDE available from M & T Chemicals of Rahway, N.J. This material can be spin coated, with die placed in the material while it is still wet. Subsequently, drying of fifteen minutes at 100° C. followed by thirty minutes at 150° C. is carried out. This material is not sensitive to acetone but is sensitive to cellosolveacetate and to methylene chloride. As such the encapsulant can be dissolved and the chips will stay in place. At this point, the top surface of the chips can be scrubbed using high pressure water scrubbing techniques in order to clean that surface of any debris which was previously on the chip or which was subsequently deposited on chips during encapsulant application and/or subsequent removal. Thereafter, a very clean source of solvent for the die attach can be used with little potential of recontaminating the chips.

A second modification in the process involves providing small holes in the substrate (11) which can assist in the operation of separating the chip from the bottom of the substrate. The holes provide three functions. They allow the solvent for the die attach to attack the die attach from a position other than the edge of the chips. Second, they provide an entry point for a small rod to actually push on the chip (14) to separate it from the substrate (11). Third, they provide an entry and distribution point for compressed air to be used to lift a chip from the substrate. Before compressed air is used, however, a cover (30) should be placed on the substrate so that chips are not literally blown away from the substrate.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An integrated circuit chip package comprising:
a substrate;
a plurality of integrated circuit chips disposed on said substrate, said integrated circuit chips each having interconnection pads thereon;
a plurality of spacer blocks disposed on said substrate such that each block is located at a side of a chip of said plurality of integrated circuit chips, with at least some of said spacer blocks being disposed between said chips;
at least one of said plurality of blocks including a connection array for applying one of a biasing signal, power signal, ground signal and clock signal to selected chip interconnection pads, said connection array having a plurality of interconnection pads;
an encapsulant surrounding said integrated circuit chips and said spacer blocks, said encapsulant having an upper surface above the tops of the integrated circuit chips and the tops of the spacer blocks and having a plurality of via openings therein, said openings being aligned with at least some of said chip interconnection pads and said connection array interconnection pads; and
a pattern of interconnection conductors disposed above the upper surface of said encapsulant so as to extend between at least some of said openings and so as to provide electrical connection to at least some of said chip interconnection pads and said connection array interconnection pads through said openings.

2. The integrated circuit package of claim 1, wherein each of said plurality of spacer blocks disposed about said chips includes a connection array having a plurality of interconnection pads thereon, each array for applying one of a biasing signal, power signal, ground signal and clock signal to selected chip interconnection pads.

3. The integrated circuit package of claim 1, wherein at least one of said spacer blocks disposed about said chips includes multiple connection arrays, each array for applying one of a biasing signal, power signal, ground signal and clock signal to selected chip interconnection pads.

4. The integrated circuit package of claim 1, wherein a plurality of said spacer blocks disposed about said chips include a connection array, at least one of said connection arrays comprising a resistive array for applying a biasing signal to selected chip interconnection pads.

5. The integrated circuit package of claim 1, wherein each of said spacer blocks disposed about said chips includes a resistive array for applying a biasing signal to selected chip interconnection pads.

6. The integrated circuit package of claim 1, wherein said encapsulant, together with said pattern of interconnection conductors disposed thereon, is removable.

7. The integrated circuit package of claim 6, wherein said encapsulant is solvent-sensitive.

8. The integrated circuit package of claim 1, wherein said substrate has a flat upper surface and said encapsulant has an upper surface which is substantially parallel to the upper surface of said substrate.

9. The integrated circuit package of claim 8, wherein the top surfaces of said blocks and the top surfaces of said chips are substantially within a common plane, said plane being parallel to the upper surface of said substrate.

10. The integrated circuit package of claim 1, wherein at least some of said plurality of chips are of different dimensions.

11. The integrated circuit package of claim 10, wherein said spacer blocks are positioned on said substrate in a predetermined pattern.

12. An integrated circuit chip package comprising:
a substrate;
a plurality of spacer blocks disposed on said substrate, said spacer blocks being spaced in a predetermined pattern which frames a multiplicity of distinct areas on said substrate's upper surface;

a plurality of integrated circuit chips disposed on said substrate, each of said chips being disposed in one of the substrate areas framed by said spacer blocks such that the chip is bounded on each side by a spacer block, said chips each having interconnection pads thereon;

at least one of said plurality of spacer blocks including a connection array for applying one of a biasing signal, power signal, ground signal and clock signal to selected chip interconnection pads, said connection array having a plurality of interconnection pads thereon;

an encapsulant surrounding said integrated circuit chips and said spacer blocks, said encapsulant having an upper surface above the tops of the integrated circuit chips and the tops of the spacer blocks and having a plurality of via openings therein, said openings being aligned with at least some of said chip interconnection pads and said connection array interconnection pads; and a pattern of interconnection conductors disposed above the upper surface of said encapsulant so as to extend between some of said openings and so as to provide electrical connection to at least between some of said chip interconnection pads and said connection array interconnection pads through said openings.

13. The integrated circuit package of claim 12, wherein each of said plurality of spacer blocks disposed about said chips includes a connection array having a plurality of interconnection pads thereon, each array for applying one of a biasing signal, power signal, ground signal and clock signal to selected chip interconnection pads.

14. The integrated circuit package of claim 12, wherein at least one of said spacer blocks disposed on said chips includes multiple connection arrays, each array for applying one of a biasing signal, power signal, ground signal and clock signal to selected chip interconnection pads.

15. The integrated circuit package of claim 12, wherein a plurality of said spacer blocks disposed about said chips include a connection array which comprises a resistive array for applying a biasing signal to selected chip interconnection pads.

16. An integrated circuit chip package comprising:
a substrate having an upper surface and a lower surface, said upper and lower substrate surfaces being substantially parallel;
at least one integrated circuit chip disposed on the upper surface of said substrate, each integrated circuit chip having interconnection pads thereon;
a solvent sensitive encapsulant surrounding said at least one integrated circuit chip, said encapsulant having an upper surface above the top of said at least one integrated circuit chip and having a plurality of via openings therein, said openings begin aligned with at least some of said chip interconnection pads; and
a pattern of interconnection conductors disposed above the upper surface of said solvent sensitive encapsulant so as to extend through at least some of said openings and so as to provide electrical connection to a least some of said chip interconnection pads.

17. The integrated circuit package of claim 16, further comprising external connect pads disposed above the upper surface of the said solvent sensitive encapsulant, at least some of said external connect pads being electrically connected to said pattern of interconnection conductors for facilitating external electrical connection to at least some of said chip interconnection pads.

18. The integrated circuit package of claim 17, wherein said external connect pads each include an outer surface of oxide-free metal.

19. The integrated circuit package of claim 18, wherein said oxide-free metal comprises gold.

20. The integrated circuit package of claim 16, wherein multiple integrated circuit chips are disposed on said substrate, each of said integrated circuit chips having interconnection pads thereon.

21. The integrated circuit package of claim 20, wherein said pattern of interconnection conductors includes external connect pads disposed above the upper surface of said solvent sensitive encapsulant, said external connect pads being disposed in a preselected pattern.

22. The integrated circuit package of claim 20, wherein at least two of said integrated circuit chips of different size.

23. The integrated circuit package of claim 22, wherein said pattern of interconnection conductors includes external connect pads disposed above the upper surface of said solvent sensitive encapsulant, said external connect pads being disposed in a preselected pattern.

24. The integrated circuit package of claim 16, wherein an adhesive material is disposed between said at least one integrated circuit chip and said substrate for adhesively securing said chip to said substrate, said adhesive material comprising a solvent sensitive material.

25. The integrated circuit package of claim 24, wherein said adhesive material is sensitive to the same solvent as said solvent sensitive encapsulant.

26. The integrated circuit package of claim 24, wherein said adhesive material is sensitive to a different sovlent than said solvent sensitive encapsulant.

27. The integrated circuit package of claim 24, wherein at least one hole is provided in said substrate extending from the lower surface to the upper surface thereof, said at least one hole being positioned under said at least one chip positioned on the upper surface of said substrate.

28. The integrated circuit package of claim 16, wherein a plurality of integrated circuit chips are disposed on the upper surface of said substrate and wherein a plurality of holes are provided in said substrate, each of said holes extending from the lower surface to the upper surface of said substrate, at least some of said plurality of chips being disposed on the upper surface of said substrate at least partially over some of said substrate holes.

29. The integrated circuit package of claim 16, further comprising at least one spacer block disposed on the upper surface of said substrate adjacent said at least one integrated circuit chip.

30. The integrated circuit package of claim 29, wherein a plurality of integrated circuit chips are disposed on the upper surface of said substrate, each of said chips having interconnection pads thereon, and wherein a plurality of spacer blocks are disposed on the upper surface of said substrate, each of said spacer blocks being positioned adjacent one of said integrated circuit chips.

31. The integrated circuit package of claim 30, wherein at least some of said spacer blocks are disposed between said plurality of integrated circuit chips.

32. The integrated circuit package of claim 30, wherein at least one of said plurality of blocks includes a connection array for applying one of a biasing signal, power signal, ground signal and clock signal to selected chip interconnection pads, said connection array having a plurality of interconnection pads, said pattern of interconnection conductors providing electrical connection between at least some of said chip interconnection pads and said connection array interconnection pads.

33. The integrated circuit package of claim 32, wherein said pattern of interconnection conductors includes a plurality of external connect pads disposed above the upper surface of said solvent sensitive encapsulant, said external connect pads being arranged in a preselected pattern.

* * * * *